United States Patent
Rohner et al.

[11] Patent Number: 5,831,249
[45] Date of Patent: Nov. 3, 1998

[54] SECONDARY MEASUREMENT OF RAPID THERMAL ANNEALER TEMPERATURE

[75] Inventors: Don Rohner; Hassan Kobeissi, both of Austin, Tex.

[73] Assignee: Advanced Micro Devices, Inc., Sunnyvale, Calif.

[21] Appl. No.: 790,962

[22] Filed: Jan. 29, 1997

[51] Int. Cl.$^6$ .................................................. A21B 1/00
[52] U.S. Cl. ..................... 219/413; 219/390; 219/405; 219/411; 392/411; 392/416
[58] Field of Search .................... 219/405, 411, 219/390; 392/411, 416, 414; 118/725, 728, 50.1

[56] References Cited

U.S. PATENT DOCUMENTS 5,228,114  7/1993  Suzuki ...................................... 219/405
5,551,985  9/1996  Brors ........................................ 392/416

*Primary Examiner*—Teresa J. Walberg
*Assistant Examiner*—Quan Nguyen
*Attorney, Agent, or Firm*—Conley,Rose & Tayon, P.C.; Eric A. Stephenson

[57] ABSTRACT

A secondary measurement of rapid thermal annealer temperature is provided. The secondary measurement allows a primary temperature measuring device to be monitored for proper operation in real time. A rapid thermal annealer system is provided having a heating chamber configured to receive and anneal a silicon wafer. Several halogen light sources are provided for heating the silicon wafer. An optical pyrometer measures temperature of the silicon wafer as it is heated by the halogen lamps. A thin silicon ring is provided with an s-type thermalcouple attached thereto. The silicon ring is positioned so that its inner edge is aligned closely with an outer edge of the silicon wafer. An s-type amplifier is connected to the s-type thermalcouple wherein the combination generates a signal indicative of the ring temperature. The ring temperature is compared against the wafer temperature as a measured by the pyrometer. If a difference between the ring temperature and wafer temperature exceeds a pre-determined value, the pyrometer is deemed to be malfunctioning and required to be repaired, recalibrated or replaced before future silicon wafers are heating using the rapid thermal annealer system.

16 Claims, 6 Drawing Sheets

SECONDARY MEASUREMENT OF RAPID THERMAL ANNEALER TEMPERATURE

BACKGROUND OF THE INVENTION

1. Field of the Invention

The present invention relates generally to the art of semiconductor manufacturing, and more particularly to an apparatus and method for secondary measurement of rapid thermal anneal temperature.

2. Description of the Relevant Art

Geometries of modern integrated circuits are reducing in size. The reduction is occurring in both the vertical and lateral directions. For example, integrated circuit components such as transistors are made in part by selectively forming source/drain regions in silicon substrate. One important vertical dimension which continues to shrink is the depth of the source/drain regions. Current CMOS VLSI devices may require the formation of low resistance source/drain regions less than 0.2 micrometers deep.

Formation of source/drain regions generally involves the introduction of a desired atomic specie into a target silicon substrate. Arsenic can be used to form n+ source/drain regions, while formation of p+ regions entails the introduction of a boron based material. The process of introducing arsenic or boron into silicon is generally referred to as doping. In the early days of integrated circuit manufacturing, dopants were supplied to the silicon substrate by chemical sources using known deposition processes. The dopants were then diffused to desired depths by subjecting the wafers to elevated temperatures.

The modern, preferred technology for forming shallower source/drain regions involves a process called ion implantation. Ion implantation provides advantages over the prior technique of supplying dopants by chemical sources. The most important advantage is the ability to more precisely control the number of implanted dopant atoms into substrates. For dopant control, ion implantation is clearly superior to chemical deposition techniques. Further, implanted impurities are introduced into the substrate with much less lateral distribution when compared to diffusion doping processes. The reduced lateral impurity penetration allows devices to be fabricated with smaller horizontal geometries.

There are, however, disadvantages associated with ion implantation techniques. Dopant implantation cannot be achieved without damage to the substrate material. That is, high energy ions collide with substrate atoms and displace them from their lattice sites in large numbers. Furthermore, only a small percentage of the as implanted atoms end up on electrically active lattice sites. In order to successfully fabricate devices, the damaged substrate regions must be restored to their pre-implanted structure and the implanted species must be electrically activated.

It has been found that subjecting ion implanted devices to elevated temperatures electrically activates implanted impurities and corrects damaged lattice structure. Correction of lattice structure damage is referred to as annealing. However, when this high temperature process step is performed, diffusion of impurities occurs simultaneously. Unfortunately, the diffusion may increase junction depths undesirably. Controlling diffusion while activating impurities and annealing silicon is difficult to achieve and requires special care and skill.

Rapid thermal processing is one technique being widely utilized to solve this paradox. Rapid thermal processing anneals silicon and activates dopants with minimal impurity redistribution. In particular, subjecting implanted wafers to rapid thermal processing cycles of approximately 1000° C. for roughly ten seconds can activate implanted layers and anneal silicon as effectively as thirty minute conventional furnace anneals, but with impurity redistribution distances of only a few hundred angstroms (compared to several thousand angstrom for conventional furnace anneals). Generally, the time-temperature cycle to reach minimum sheet resistance for certain dopants is 5 to 10 seconds at 1000° C.–1200° C., the exact condition being dependent on implanted species, energy and dose.

Rapid thermal processing must be performed in specially designed systems. The large thermal mass of conventional furnaces rules them out as possible systems for performing short thermal cycles. Rapid thermal annealers (RTA) have been developed to overcome conventional furnace limitations. FIG. 1 shows an example of one such RTA system which includes a heating chamber 10, heat sources 12, and an optical pyrometer 14 which will be more fully described below. The RTA system employs heat sources which emit radiant light, which then heats wafers contained in a heating chamber. Various heat sources are utilized, including arc lamps and tungsten halogen lamps. These heat sources allow very rapid and uniform silicon wafer heating. Temperature uniformity is an important design consideration in these systems, so that thermal gradients, which can damage the wafers, are minimized. Wafers within rapid thermal annealer systems are supported on pins and isolated from conductive heating, so the radiant (not conductive) heating is dominant. Radiant heating promotes a more uniform temperature during the annealing process.

Precise control of the time during which wafers are subjected to elevated temperatures is necessary to obtain desired rapid thermal annealing results. Optical pyrometers are used to accurately measure and control wafer temperature during the annealing process. The optical pyrometer operates by measuring emissivity of light reflected from the heated wafer. The measured emissivity is then used to calculate wafer temperature and adjust radiant heating provided by the light sources.

Optical pyrometers provide a high degree of accuracy in wafer temperature measurement when they are operating properly. If the pyrometer suddenly experiences an operating malfunction during production annealing, a significant number of wafers may be improperly heated before the pyrometer malfunction is detected. For example, wafers may be improperly heated to temperatures above or below carefully calculated annealing temperatures as a result of false pyrometer temperature measurement. Improperly annealed wafers usually fail to meet design specifications and typically are discarded as unusable. To protect production yield rates, it becomes important to monitor the pyrometer to assure that it is producing accurate temperature measurements and that wafers are being properly annealed.

FIG. 1 shows a prior art technique for monitoring pyrometer operation which involves placing a sample wafer 16 into the heating chamber. A thermocouple 18 is attached to the sample wafer 16 and provides a fairly accurate temperature measurement thereof. Sample wafer 16 is subjected to a test annealing cycle where light sources 12 produce intense radiant energy which raises wafer temperature quickly to, for example, 1000 degrees celsius. The pyrometer and thermocouple generate signals relating to wafer temperature. If their signals generally coincide, the pyrometer is deemed to be operating within normal parameters and production annealing of wafers is allowed to proceed. If the pyrometer is malfunctioning, the signals will vary significantly, and production annealing of wafers cannot proceed until the pyrometer is modified either by being recalibrated, or replaced.

These are several problems associated with this prior art technique of monitoring pyrometer operation. One problem is that the prior method is both time consuming and expensive. The process of attaching a thermocouple to a sample wafer, placing the sample wafer in the heating chamber, subjecting the sample wafer to a test annealing cycle, and comparing operation of the thermocouple against the pyrometer requires a great deal of time. This method is expensive since while the pyrometer is being checked for proper operation, the RTA cannot be used for its intended purpose, i.e. production annealing of implanted wafers. Further, the pyrometer must be checked frequently to insure that it is operating properly. Each time the pyrometer is checked, the RTA is not being productively used.

A second and more critical problem with the prior art method is that it does not provide real time monitoring of pyrometer operation. Typically, the pyrometer is usually checked only once a day using the prior art method since it is time consuming and expensive. If, in the course of the day, the pyrometer experiences a sudden malfunction, the malfunction will not be detected until the next day when the pyrometer is once again checked for proper operation. Until the problem is discovered, the pyrometer may cause a significant number of wafers to be improperly annealed.

SUMMARY OF THE INVENTION

The problems outlined above are in large part solved by employing a secondary measurement of rapid thermal annealer temperature according to the present invention. The secondary measurement allows a primary temperature measuring device of a rapid thermal annealer (RTA) to be monitored for proper operation in real time, i.e. while wafers are being annealed by the RTA. If a primary temperature measuring device malfunction develops, the present invention provides a technique for immediate detection thereof which can prevent improper annealing of subsequent wafers.

In accordance with one aspect of the present invention, a rapid thermal annealer system is provided having a heating chamber configured to receive and anneal a silicon wafer. A first heat source, preferably several halogen light sources, are positioned inside the heating chamber adjacent the chamber wall at various locations. The halogen light sources provide radiant energy for rapidly heating the received silicon wafer. First temperature measuring device, preferably an optical pyrometer, measures temperature of the received silicon wafer as it is heated by the halogen light sources. The optical pyrometer generates a first signal indicative of the wafer temperature which is used to carefully control the heat generated by the light sources.

A thin silicon ring positioned close to the received silicon wafer, is provided to promote uniform heating of the received silicon wafer during its annealing cycle. Normally, wafers, when heated without the adjacent ring, experience a non-uniform temperature distribution due to increased heat loss along the outer edge. In other words, heat loss at the edges can be greater than heat loss at the center of the wafer causeing temperature at the outer edge to be lower than the temperature at center. The silicon ring, when added, is heated by radiant energy from the halogen light sources to a temperature which is greater than the temperature at the outer edge of the received wafer. The silicon guard ring does not experience a significant temperature gradient and generally has a temperature equal to the center of the silicon wafer. The ring acts as a second heat source to the wafer and due to the temperature differential between ring and outer edge of wafer, heat from the silicon ring offsets heat loss from the silicon wafer edge thereby producing a more uniform wafer gradient.

A second temperature measuring device, preferably an s-type thermal couple connected to an s-type amplifier, is connected to the ring to measure temperature thereof as the ring is being heated alongside the silicon wafer by the halogen light sources. The s-type amplifier generates a second signal which represents the temperature of the silicon ring.

The optical pyrometer and s-type amplifier may be connected to a comparator which receives the first and second signals. The comparator generates a warning signal indicating that the optical pyrometer is not accurately measuring silicon wafer temperature when a difference between the first and second signals exceeds a predefined value. In this situation, the pyrometer must be modified either by being repaired, recalibrated or replaced before further silicon wafers are ananealed using the rapid thermal annealer system.

One advantage of the present invention is that is provides for real time monitoring of the optical pyrometer during rapid thermal annealing.

Another advantage of the present invention is that it increases productive use of RTAs.

Still another advantage of the present invention is that it reduces the risk of improperly annealing wafers due to pyrometer malfunction.

BRIEF DESCRIPTION OF THE DRAWINGS

Other objects and advantages of the invention will become apparent upon reading the following detailed description and upon reference to the accompanying drawings in which.

Figure 1:
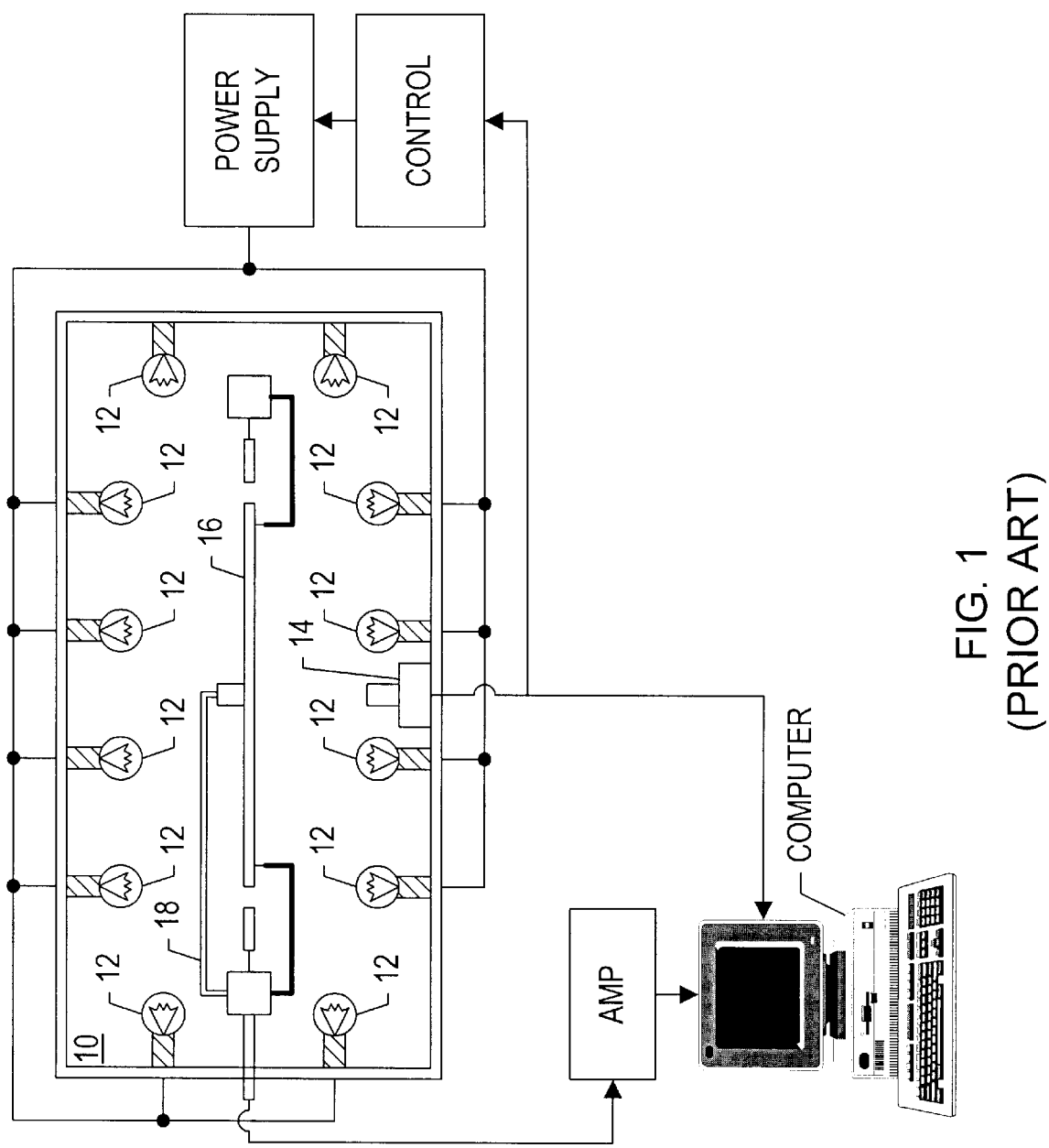
FIG. 1 is a partial side view of a rapid thermal annealer of the prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
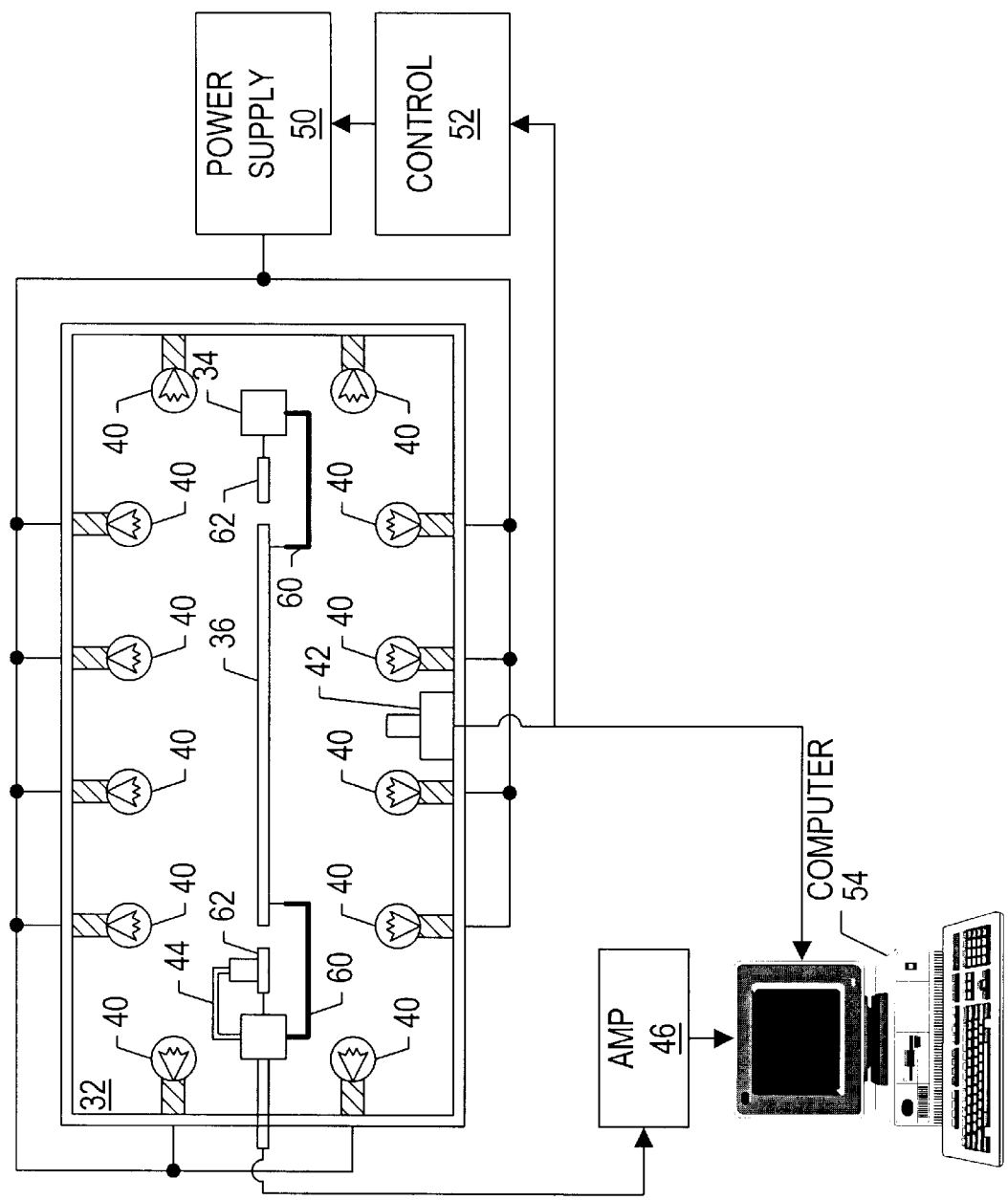
FIG. 2 is a partial side view of a rapid thermal annealer employing the present invention

FIG. 2 shows a partial side view of a rapid thermal annealer (RTA) system 30 employing the present invention.

The RTA system 30 includes: a heating chamber 32; a quartz tray 34 supporting a silicon wafer 36 to be annealed; a first heat source which, in the preferred embodiment, includes a plurality of halogen lamps 40; a first temperature measuring device which, in the preferred embodiment, includes an optical pyrometer 42; a second temperature measuring device which, in the preferred embodiment, includes an s-type thermal couple 44 connected to an s-type amplifier 46; a power supply 50 which provides electric power to halogen lamps 40; a power supply regulator or control 52 which regulates power supplied to halogen lamps 40 in accordance with a signal received from the pyrometer, and; a general purpose computer 54 connected to S type amplifier 46 and the pyrometer 42.

Pyrometer 42 is positioned inside heating chamber 32 and operates to control the amount of radiant heat applied to wafer 36. The Pyrometer 42 samples light reflected from a lower surface of wafer 36. The reflected light contains emissivity information with respect to wafer 36. Pyrometer 42 generates a signal indicative of the wafer temperature as a function of wafer emissivity. The signal is output to both the general purpose computer 54 and power supply control 52.

General purpose computer 54 is configured to display wafer temperature to an operator. Alternatively, general purpose computer 54 may record the wafer temperatures in memory. Control 52 receives the wafer temperature signal and regulates power supplied to halogen lamps 40 in accordance with a predetermined rapid thermal anneal cycle. For example, control 52 causes lamps 40 to quickly heat wafer 36 until wafer 36 reaches an anneal temperature of approximately 1010 degrees. Once anneal temperature is reached, control 52 initiates a cooling cycle which includes decreasing the amount of power supplied to lamps 40 by supply 50.

Figure 3:
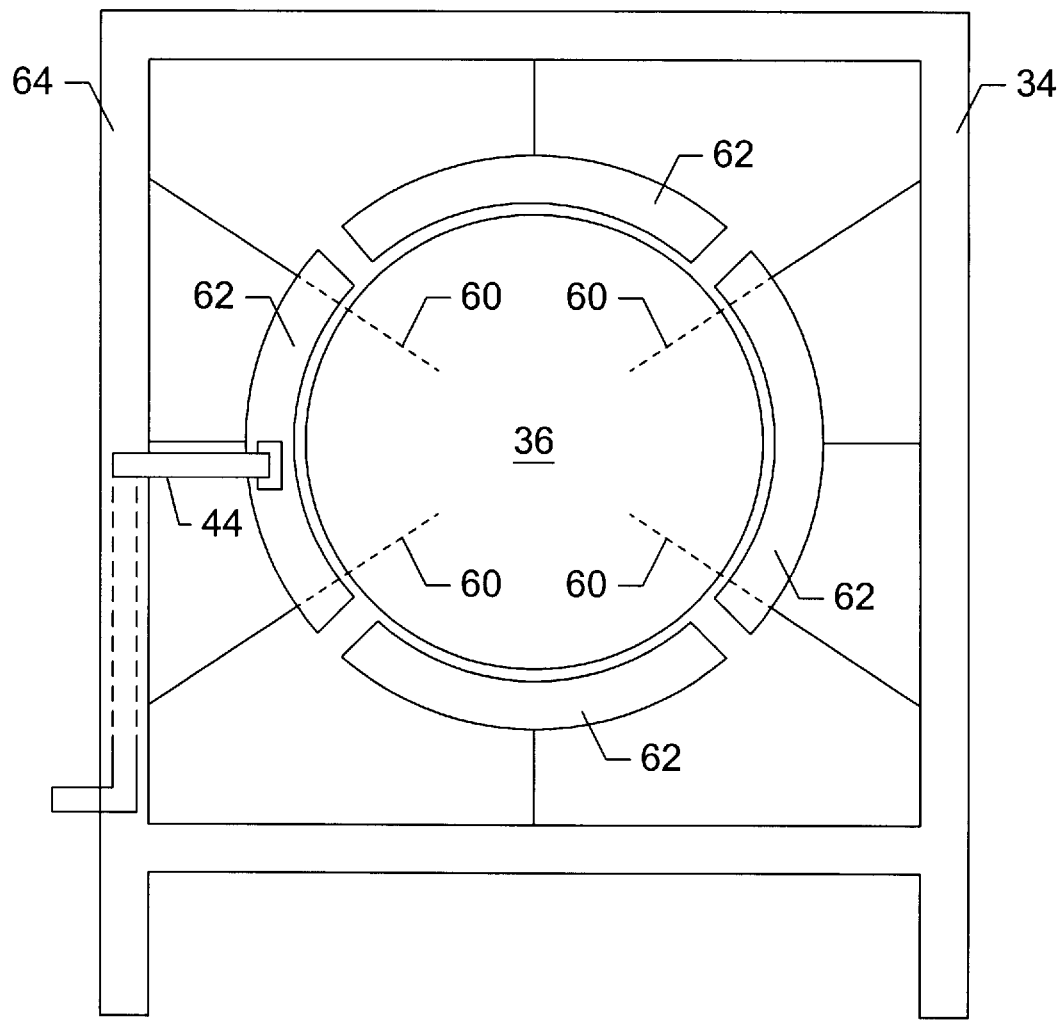
FIG. 3 is a top view of the tray, silicon wafer, and s-type thermalcouple according to the present innovation.

With continuing reference to FIG. 2, FIG. 3 shows a top view of tray 34 with silicon wafer 36 received thereon. Tray 34 includes: pins 60 for supporting and isolating wafer 36 from conductive heating; thin ring 62 closely positioned at an outer edge of silicon wafer 36, and; a frame 64.

Thin ring 62 is positioned planar with wafer 36 and is formed from a material having substantially similar heating characteristics to wafer 36. In the preferred embodiment, ring 62 is formed from silicon it being understood that other materials can also be used. Ring 62 heats an outer edge of wafer 36 to ensure a uniform temperature across wafer 36 during the annealing process. Without ring 62, a temperature gradient could exist across wafer 36 whereby a center of wafer 36 could have a higher temperature than the outer edge. This gradient, unless corrected, could produce a non-uniform pattern in annealing and dopant activation across the wafer which in turn may produce devices with varying operating characteristics, some of which may fail to meet design specifications.

Ring 62 is heated by halogen lamps 40 concurrently with the heating of wafer 36. Ring 62 is configured to absorb radiant energy and provide heat to wafer 36. The ring, however, heats to a temperature greater than the temperature of the outer edge of the silicon wafer 36 since wafer heat loss is greater at the outer portions thereof when compared to heat lose at the inner portions. The added heat provided to outer edge 46 by ring 62 offsets heat loss in order to reduce temperature gradients across wafer 16. As such, the ring acts as a heat source to the outer edge of the wafer 36. Ring temperature closely follows temperature of the wafer 36 near its center. In effect, the rings maintains wafer 36 at a more uniform temperature during the annealing process. Ring 62 also has substantially the same temperature as wafer 36.

S-type thermocouple 44 is well known in the art. According to the present invention as shown in FIGS. 2 and 3, s-type thermocouple has a first end connected to a surface of the ring 62 using a ceramic based cement. The ceramic based cement conductively transmits heat from the ring 62 to the s-type thermocouple. A second end of s-type thermocouple is connected to an input of s-type amplifier 46. The body of s-type thermal couple extends between first and second ends thereof through a passage defined within the frame 64 of quartz tray 34. To the extent possible, s-type thermo-couple is insulated against heat transmission using a quartz cover. With the s-type thermocouple physically attached to ring 62 and insulated against heat transmission, s-type thermocouple's temperature closely follows the temperature of ring 62 which in turn closely follows the temperature of wafer 36. Accordingly, s-type thermocouple 44 closely follows or tracks the temperature of wafer 36 during the rapid thermal annealing cycle.

Standard RTA systems include an s-type amplifier 46 having an input configured to be connected to an s-type thermocouple. A metal connection between the thermocouple and the amplifier produces a voltage differential which is amplified and output for subsequent processing. Further, the output voltage depends on any differential temperature between the s-type thermocouple and s-type amplifier whereby the greater the temperature of the s-type thermocouple, the greater the magnitude of the output voltage from the s-type amplifier. As such, the combination of the s-type thermocouple 44 and amplifier 46 operates as a temperature measuring device generates a signal indicative of wafer temperature as wafer 36 undergoes a rapid thermal anneal cycle.

Figure 4:
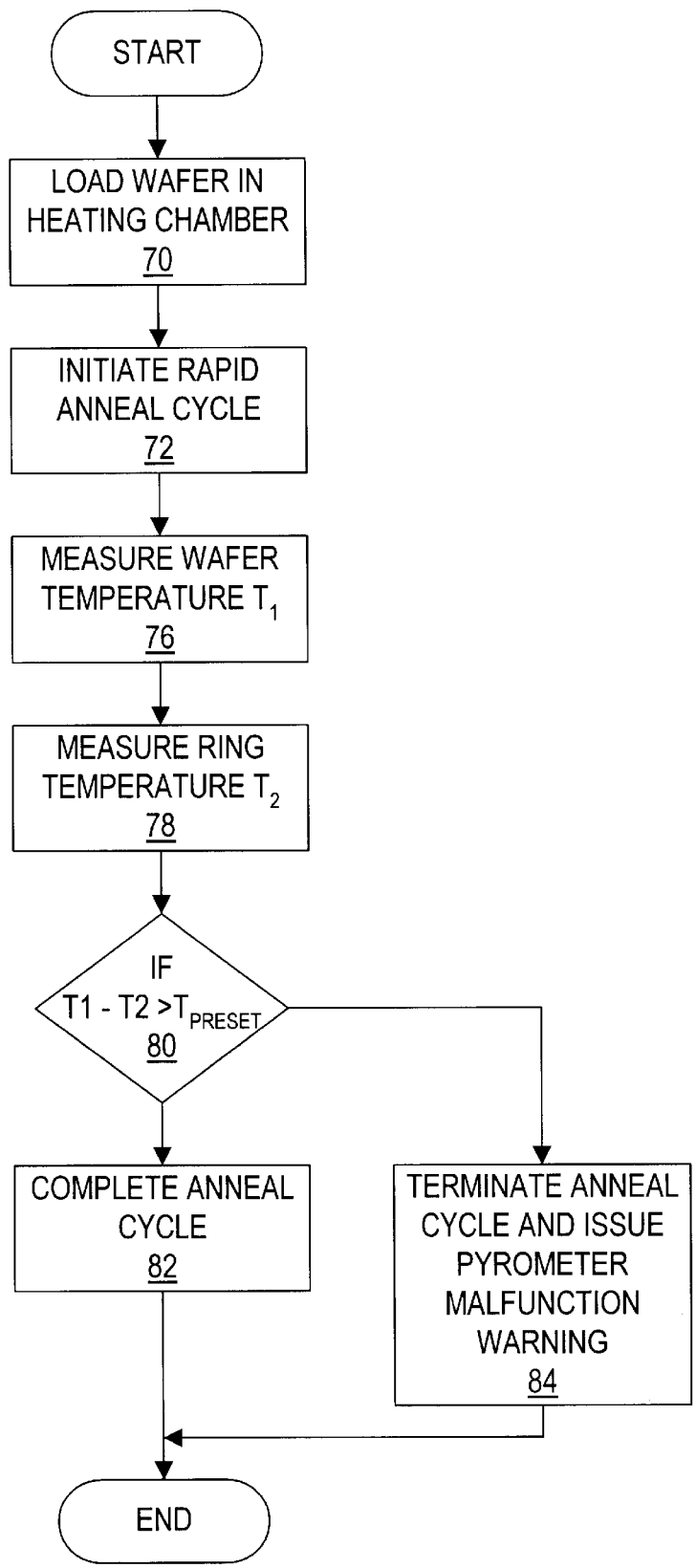
FIG. 4 is a flow chart describing a method of the present invention.

With continued reference to FIGS. 2 and 3 and with further reference to FIG. 4, operation of the RTA system 30 will now be more fully explained. Beginning with step 70, tray 34 along with silicon wafer 36 received therein, is positioned inside heating chamber 32. At step 72, halogen lamps 40 generate radiant energy which heats silicon wafer 36 and thin ring 62 thereby initiating the rapid thermal anneal cycle. As wafer 36 and guard ring 62 receive the radiant energy, their temperatures increase accordingly. At step 74 pyrometer 42 samples light reflected from wafer 36. The sampled light includes information related to emissivity of wafer 36. Pyrometer uses the emissivity information to generate a first signal representative of the temperature of wafer 36. S-type thermocouple 44 and amplifier 46 measures guard temperature at step 76 and generates a second signal representative thereof at step. Thereafter, the first and second signals are compared to each other in step 80. If the temperatures as represented by the signals are sufficiently close to each other, the rapid thermal anneal cycle is allowed to proceed to completion in step 82. If wafer temperature exceeds guard ring temperature by a predetermined amount, or vice versa, then at step 84 the rapid thermal anneal cycle is terminated and a warning is issued indicating that pyrometer 42 is improperly measuring wafer temperature and may need to be modified either by being repaired, recalibrated or replaced before further wafers are subsequently annealed.

In one embodiment, step 78 is performed by an operator who compares the two signals generated by the pyrometer 42 and s-type thermocouple 44 and amplifier 46. In particular, the temperatures of the wafer 36 and ring 62 as represented by the first and second signals are provided to computer 54 for display and review by the operator. If the temperatures diverge significantly, the operator can terminate the rapid thermal anneal cycle and begin an analysis of the pyrometer to determine the source of its malfunction.

Figure 5:
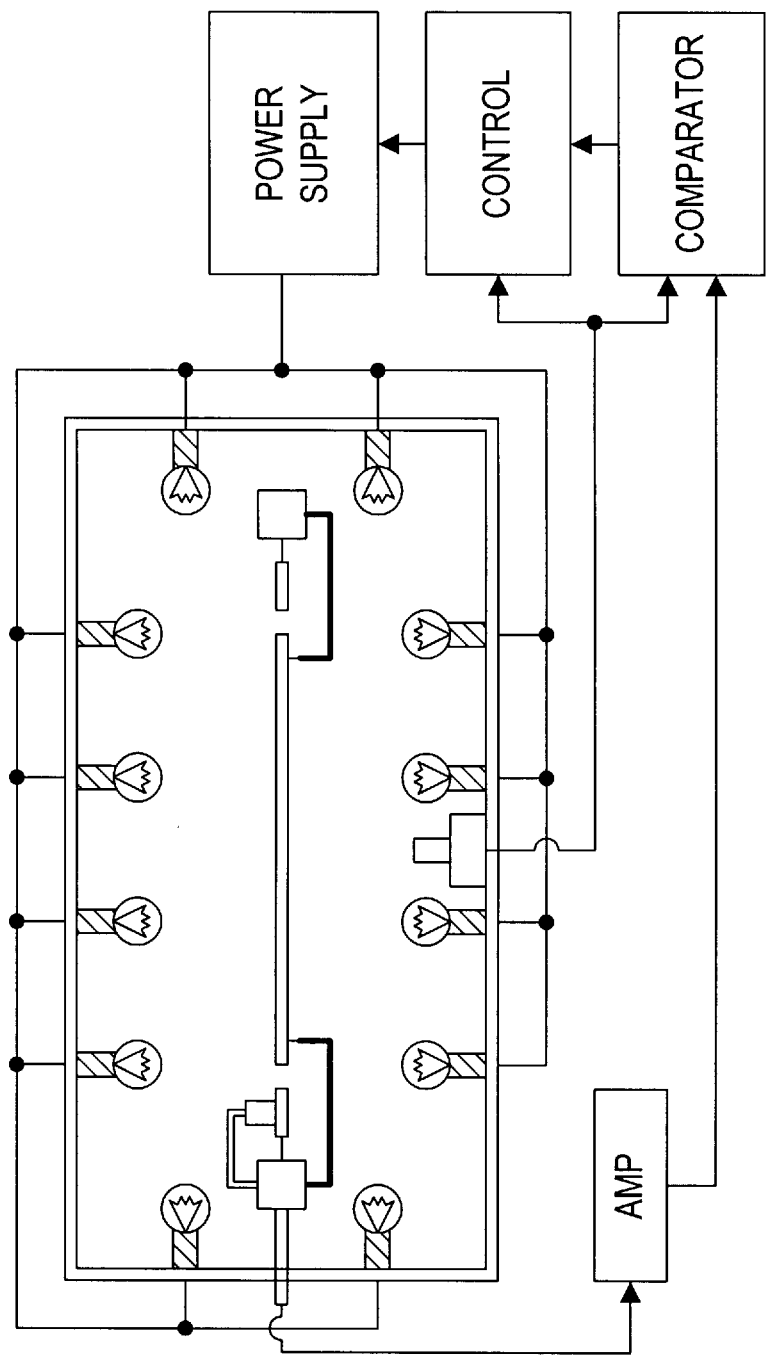
FIG. 5 is a partial side view of a rapid thermal annealer employing an alternative embodiment of the present invention.
Figure 6:
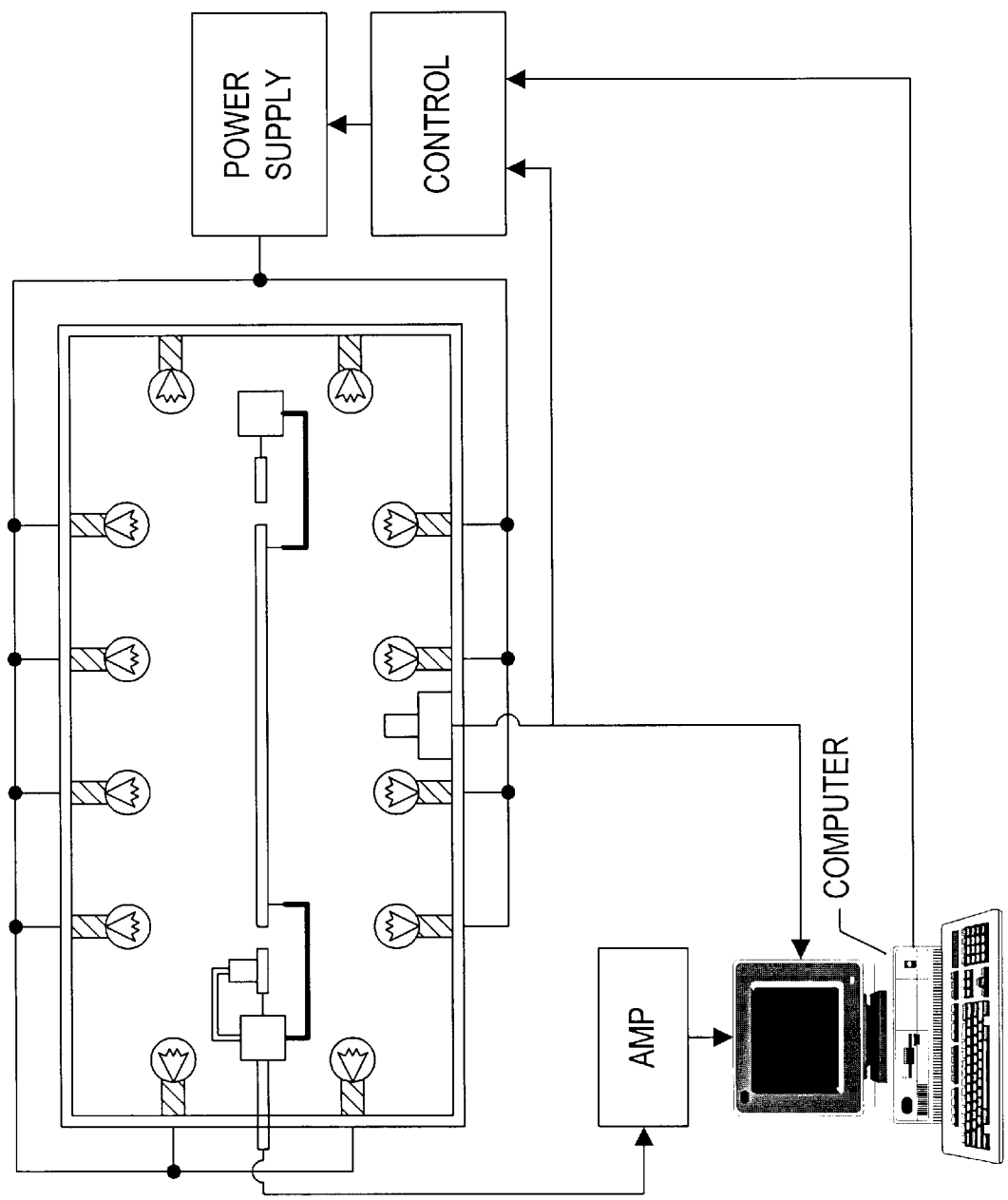
FIG. 6 is a partial side view of a rapid thermal annealer employing an alternative embodiment of the present invention.

Alternatively, the first and second signals may be compared using a monitor system such as a computer 54 as shown in FIG. 5 or an independent comparator circuit 66 as shown in FIG. 6. In each of these alternative embodiments, the monitor system which compares the first and second signals is connected to power supply control 52. The monitoring system, whether the general purpose digital computer 54 in FIG. 5 or the comparator circuit 66 of FIG. 6, receives the first and second signals from the pyrometer 42 and s-type thermocouple 44 and amplifier 46, calculates a difference between the two, and compares the difference to a preset value. If the preset value is exceeded by the difference in the first and second signals, the monitoring system issues an interrupt signal which causes control 66 to terminate the rapid thermal anneal cycle. The interrupt signal can also serve as a notice that the pyrometer requires maintenance or replacement.

Tables 1 and 2 below show experimental results of testing the present invention. Specifically, Table 1 shows temperature values in two columns where (1) the first column represents temperature of the silicon ring 62 as measured by the s-type thermalcouple 44 and amplifier 46, and (2) the second column contains concurrent measurements of a wafer provided by the pyrometer 42. Generally, there is about a 150 degree temperature difference between horizontal entries in Table 1. However, the difference is of no concern. Rather, what is important is that there is a very small deviation vertically within the first column. Specifically, the temperature of the ring as measured by the s-type thermal couple and amplifier has an error of + or −3.5° C. when measured against set point temperature of 1010° C. measured by the pyrometer.

Table 2 shows the results of measuring ring temperature using the s-type thermal couple and amplifier as wafer temperature is varied and measured using the pyrometer. This table shows that temperature measurements by the thermalcouple experiences a 0.8° C. change for each 1° C. change in temperature as measured by the pyrometer. Table 2 suggests that sensitivity is sufficient that the s-type thermalcouple and amplifier accurately tracks wafer temperature as measured by the pyrometer.

TABLE 1

| S-type thermalcouple and amplifier temperature measurements | Pyrometer temperature measurements |
| --- | --- |
| 865.2 | 1010° C. |
| 861.2 | 1010° C. |
| 860.3 | 1010° C. |
| 859.7 | 1010° C. |
| 869.4 | 1010° C. |
| 858.8 | 1010° C. |
| 859.1 | 1010° C. |
| 858.8 | 1010° C. |
| 859.1 | 1010° C. |
| 858.1 | 1010° C. |
| 859.7 | 1010° C. |
| 860.3 | 1010° C. |
| 859.4 | 1010° C. |
| 860.9 | 1010° C. |
| 859.4 | 1010° C. |
| 861.2 | 1010° C. |
| 863.5 | 1010° C. |
| 863.4 | 1010° C. |
| 860.3 | 1010° C. |
| 863.4 | 1010° C. |
| 862.6 | 1010° C. |

TABLE 2

| 1000 | 855.8 |
| --- | --- |
| 995 | 851.9 |
| 990 | 847.8 |
| 985 | 843.9 |
| 980 | 839.6 |

It will be appreciated to those skilled in the art having the benefit of this disclosure that this invention is believed to be capable of monitoring in real time the operation of the primary temperature measuring device, namely the optical pyrometer, within an RTA system. Numerous variations and modifications will become apparent to those skilled in the art once the above disclosure is fully appreciated. It is intended that the following claims be interpreted to embrace all such variations and modifications.

What is claimed is:

1. A wafer heating system comprising:

a heating chamber configured to receive a silicon wafer;

a silicon member positioned inside the heating chamber;

a first heating system, for simultaneously heating the received silicon wafer and the silicon member;

a first temperature measuring device for measuring a temperature of the received silicon wafer;

a second temperature measuring device attached to the silicon member, for measuring a temperature of the silicon member, and;

a monitoring system connected to the first and second temperature measuring devices, wherein the monitoring system monitors a difference between the measured temperature of the silicon member and the measured temperature of the received silicon wafer, wherein the monitoring system identifies a first temperature measuring device malfunction when the difference between the measured temperatures of the silicon wafer and member exceed a predefined value.

2. The wafer heating system of claim 1 wherein the silicon member is defined by a ring having an inner edge in close proximity with an outer edge of the received silicon wafer.

3. The wafer heating system of claim 1 wherein the first heating system comprises a lamp for generating radiant energy which illuminates the received silicon wafer and member.

4. The wafer heating system of claim 1 wherein the silicon member is configured to have heating characteristics substantially similar to heating characteristics of the received silicon wafer.

5. The wafer heating system of claim 1 wherein the second temperature measuring device comprises an s-type thermocouple connected to an s-type amplifier.

6. The wafer heating system of claim 1 wherein the second temperature measuring device is attached to the silicon member using a ceramic adhesive.

7. The wafer heating system of claim 5 wherein the s-type amplifier is connected to the monitoring system.

8. The wafer heating system of claim 1 wherein the first heating system includes;

a plurality of lamps for generating radiant energy which illuminates the received silicon wafer and silicon member;

an adjustable power supply connected to the lamps, for supplying power to the plurality of lamps, and;

a power supply regulator connected to the first temperature measuring device and the adjustable power supply, wherein the power supply regulator adjusts power supplied to the lamps in response to the measured silicon wafer temperature.

9. A wafer heating system comprising:

a heating chamber configured to receive a silicon wafer;

a silicon member positioned inside the heating chamber;

a first heating system, for simultaneously heating the received silicon wafer and the silicon member;

a first temperature measuring device for measuring a temperature of the received silicon wafer and generating a first signal indicative thereof, the first temperature measuring device being connected to the first heating system wherein the first heating system operates in response to the first signal;

a second temperature measuring device for measuring a temperature of the silicon member and generating a second signal indicative thereof, wherein the first and second signals are useable for identifying a first temperature measuring device malfunction, wherein the malfunction is identified when a difference between the first and second signals exceeds a predetermined value.

10. The wafer heating system of claim 9 wherein the second temperature measuring device is connected to the silicon member.

11. The wafer heating system of claim 9 wherein the second temperature sensing device includes an s-type thermocouple connected to an s-type amplifier.

12. The wafer heating system of claim 10 wherein the second temperature measuring device is attached to the silicon member using a ceramic adhesive.

13. The wafer heating system of claim 9 wherein the silicon member includes a ring of thin strips of silicon having an inner edge positioned adjacent an outer edge of the received silicon wafer.

14. The heating system of claim 9 wherein the first temperature monitoring device comprises an optical pyrometer which samples light reflected from the received silicon wafer and which measures the temperature of the received silicon wafer as a function of the sampled reflected light.

15. A method of monitoring a primary temperature measuring device in a rapid thermal annealer, the method comprising the steps of:

measuring a temperature of a wafer received in the rapid thermal annealer using the primary temperature measuring device;

measuring a temperature of a silicon member positioned adjacent the wafer using a secondary temperature measuring device;

calculating a difference between the temperature of the silicon member and the temperature of the silicon wafer;

comparing the calculated difference with a predetermined value;

modifying the primary temperature measuring device when the calculated difference exceeds the predetermined value.

16. The method of claim 15 further comprising generating a signal identifying a primary temperature measuring device malfunction when the calculated difference exceeds the predetermined value.

* * * * *